United States Patent [19]

Defranould et al.

[11] Patent Number: 4,975,892
[45] Date of Patent: Dec. 4, 1990

[54] PIEZOELECTRIC TRANSDUCER TO GENERATE BULK WAVES

[75] Inventors: Philippe Defranould, Nice; Claude Poncot, Valbonne, both of France

[73] Assignee: Thomson-CSF, Puteaux, France

[21] Appl. No.: 388,000

[22] Filed: Aug. 1, 1989

[30] Foreign Application Priority Data

Aug. 5, 1988 [FR] France .................. 88 10610

[51] Int. Cl.$^5$ ............................................ H04R 17/00
[52] U.S. Cl. .................... 367/140; 350/358; 310/334; 310/365
[58] Field of Search ............... 367/140, 157; 350/358; 310/352, 365, 334

[56] References Cited

U.S. PATENT DOCUMENTS

| | | | |
|---|---|---|---|
| 3,453,711 | 7/1969 | Miller | 310/334 |
| 3,587,005 | 6/1971 | Fair | 310/334 |
| 4,611,141 | 9/1986 | Hamada et al. | 310/334 |
| 4,666,547 | 5/1987 | Snowden, Jr. et al. | 156/280 |
| 4,755,708 | 7/1988 | Granz et al. | 310/334 |
| 4,800,317 | 1/1989 | Ingle et al. | 310/334 |

FOREIGN PATENT DOCUMENTS 2001468 7/1971 Fed. Rep. of Germany.
2046554 11/1980 United Kingdom.

OTHER PUBLICATIONS

Patent Abstracts of Japan, vol. 3, No. 18 (E-91), Feb. 16, 1979, p. 6 E91; Masashi Makino, 12-18-78.
Microwave Journal, vol. 18, No. 9, Sep. 1975, pp. 44-47, Dedham, U.S.A.; A. Schaer et al.; "Soldered Piezoelectric Transducer Acoustic-Wave Components".

*Primary Examiner*—Charles T. Jordan
*Assistant Examiner*—J. Woodrow Eldred
*Attorney, Agent, or Firm*—Oblon, Spivak, McClelland, Maier & Neustadt

[57] ABSTRACT

The transducer is chiefly designed to generate acoustic waves in the microwave range in a crystalline support of a bulk wave delay line or a Bragg cell. The transducer has a plane contact region of a ground electrode partially covering a face of the substrate, a piezoelectric plate on the contact region and a second electrode defining the piezoelectrically active region of the transducer. So as not to make a direct solder on the electrode and thus, in particular, reduce the admittance of the transducer as compared with known transducers, the second electrode is connected to a large connection region, placed on the support face, by a link bridge. The connection region supports the connection by soldering. The admittance is thus independent of the thickness of the solder.

13 Claims, 3 Drawing Sheets

PIEZOELECTRIC TRANSDUCER TO GENERATE BULK WAVES

BACKGROUND OF THE INVENTION

1. Field of the Invention

The present invention concerns a piezoelectric transducer and, more particularly, a transducer used to generate bulk waves in the microwave range, of the order of one gigahertz, in a crystalline substrate constituting a support. The generation of bulk waves enables the making of a bulk wave delay line, or an acousto-optical transducer, called a Bragg cell, to diffract and modulate this incident laser beam.

2. Description of the Prior Art

FIG. 1 appended hereto gives a schematic view of a bulk wave line comprising a substrate SC, such as a bar of corundum, and a piezoelectric transducer supported by a plane face FS of the substrate. A first electrode E1 of the transducer is formed by a ground contact plane which is metallized throughout the substrate face FS. A thin piezoelectric plate LP with a high coupling coefficient is centered on the metallized plane electrode E1. At the center of this plate, a second electrode E2 is deposited. The electrodes E1 and E2 are connected to a microwave signal generator GH, such as a reception antenna amplification circuit, for example by means of an impedance matching microstrip microwave line on ceramic substrate, to produce microwave acoustic waves OA that are propagated longitudinally in the substrate SC and perpendicularly to the face FS of this substrate.

For reasons of technological ease and dependability, the plate LP is appreciably bigger than the second electrode E2, which should be small to reduce the electrical capacitance of the piezoelectric transducer and thus increase the efficiency of this transducer. However, the admittance of the transducer cannot be reduced to the extent desired, because of the solder spot or "ball" covering the second electrode E2, necessary to connect it to the generator GH. For, the "ball" of solder has a diameter equal to at least 50 $\mu$m and the dimensions of the electrode E2 therefore cannot be smaller than this dimension.

Furthermore, through its weight, the "ball" of solder causes non-reproducible disturbances in the generation of the acoustic waves and offers a relatively high degree of series self-inductance.

During the soldering operation, there is the risk that the electrode E2 as well as the plate LP may be damaged.

The present invention is therefore aimed at overcoming mainly the drawbacks inherent in the direct connection, by soldering, of the second electrode, in moving over the connection of this electrode so as to make its dimension independent of the size of the solder. A smaller effective contact region of the second electrode is obtained, enabling the admittance of the piezoelectric transducer to be reduced.

SUMMARY OF THE INVENTION

To this end, the invention proposes a piezoelectric transducer comprising a plane contact region of a first electrode, placed on a face of a support, a piezoelectric plate placed on the contact region, and a second electrode designed to be connected, by soldering, to a connection wire, wherein the second electrode is electrically connected to a connection region by a link bridge straddling one side of the piezoelectric plate, said connection region being placed on the supporting face and supporting the solder at the connection wire.

Through the link bridge which may be called an "air gap bridge" or an "overhead" bridge, the connection of the second electrode is moved over to the connection region. This connection region has a considerably greater area than that of the second electrode to be soldered to a connection wire without the slightest risk of damage to the piezoelectric plate and to the second electrode. The dimensions of the second electrode are then independent of the thickness of the solder, and may thus achieve dimensions substantially smaller than 50 $\mu$m, typically smaller than 30 $\mu$m. The piezoelectric transducer may be directly connected to a microwave source with a very low admittance.

According to another aspect of the invention, a piezoelectric transducer can be manufactured in the following four successive steps, after deposition of the contact region of the first electrode, the piezoelectric plate and the second electrode on the face of the support:

(A) Deposition of a layer of resin partially on the piezoelectric plate and the second electrode, and on the support face, on either side of the plate side to be straddled by said bridge, (B) Deposition of a metallic layer to cover at least the resin layer and a portion of the support face not covered by the contact region.

(C) Machining of the metallic layer to define at least the link bridge and the connection region connected to the second layer, and (D) Removal of the resin layer.

As shall be seen further below, a fabrication method such as this is well suited to the fabrication of a set of piezoelectric transducers juxtaposed on the face of the support and having, in common, a single first electrode contact region with a view to giving a set of Bragg cells arranged in parallel.

BRIEF DESCRIPTION OF THE DRAWINGS

Other advantages and features of the invention will appear more clearly from the reading of the following description of several preferred embodiments of the invention, with reference to the corresponding, appended drawings wherein.

DESCRIPTION OF PREFERRED EMBODIMENTS

Figure 1:
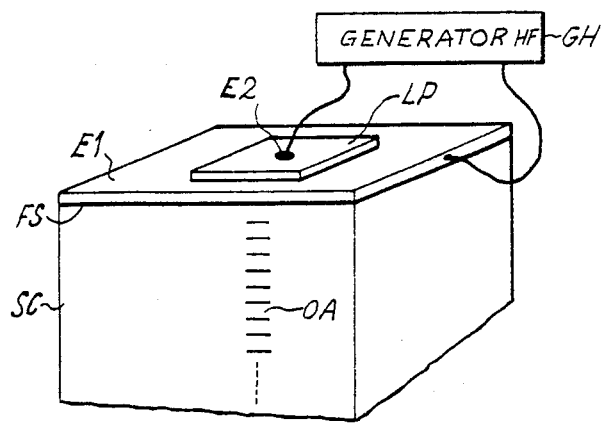
FIG. 1 shows a schematic view in perspective of the piezoelectric transducer for bulk wave lines, according to the prior art described above.
Figure 2:
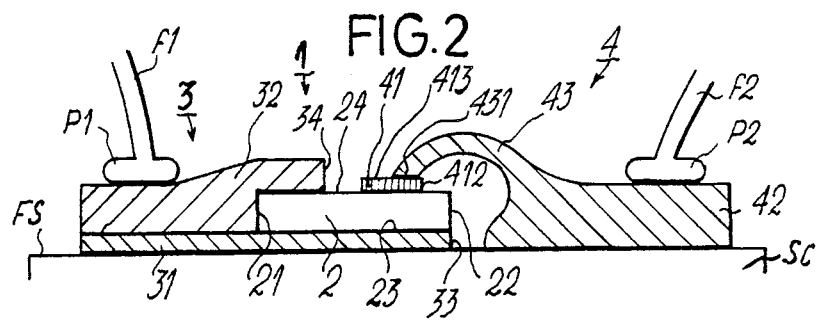
FIG. 2 is a vertical and longitudinal sectional view, taken along the line II—II of FIG. 3, of a piezoelectric transducer according to the invention.
Figure 3:
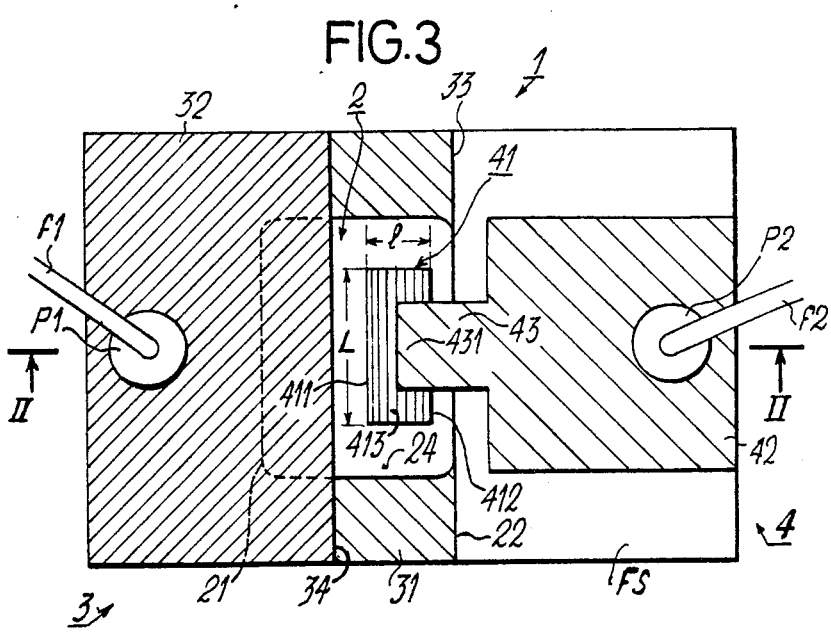
FIG. 3 is a top view of the piezoelectric transducer according to the invention.

Referring to FIGS. 2 and 3, a piezoelectric transducer 1, according to the invention, is supported by one face FS of the small, plane, terminal, transversal faces of a crystalline substrate SC, such as a corundum bar, to form a bulk wave line. The piezoelectric transducer 1 has a rectangular piezoelectric plate 2, located substantially above the center of the face FS of the substrate. The plate is appreciably smaller than the face FS. A first electrode 3, called a ground electrode, of the transducer 1 is located, to a major extent, laterally to a first large side 21 of the plate 2, on the left-hand side in the FIGS. 1 and 2. A second connection set 4 of the transducer 1 is located, to a major extent, laterally to a second large side 22 of the plate 2, to the right in FIGS. 1 and 2.

The first electrode 3 is formed by a rectangular, plane, contact region 31 which is placed on the face of the substrate FS, partially beneath the entire plate 2, and by a connection region 32 between the contact region 31 and a first connection wire f1. The contact region 31 is a metallic sub-layer, made of gold for example, with a thickness of about 0.05 $\mu$m. The sub-layer of the contact region 31 covers only the left-hand part of the substrate face FS up to the large side 22 of the piezoelectric plate 2. The region 31 is in contact with the entire lower face 23 of the plate 2 and offers a longitudinal edge 33 which is coplanar with the plate side 22 and perpendicular to the face FS. The connection region 32 of the first electrode 3 is, for example, also made of gold and covers the left-hand part of the contact region 31 lateral to the large side 21 of the plate as well as a part of the upper face 24 of the plate 2, on the side 21, to form an edge 34 substantially vertical to the plate 2. The thickness of the connection region 32 is equal to about 0.4 $\mu$m. Substantially at the center of the upper face of the part of the connection region 32 which covers the contact region 31, a small solder pellet P1 connects one end of the wire f1, also made of gold, to the connection region 32.

The piezoelectric plate 2 is made of piezoelectric material such as lithium niobate $LiNbO_3$, or zinc oxide ZnO, and typically has a thickness of 0.3 $\mu$m. The side 22 of the plate is machined simultaneously with the left-hand edge 33 of the ground contact region 31 so that this side and this edge are aligned perpendicularly with the substrate face FS.

The connection unit 4 has a second electrode 41 placed on the right-hand part of the upper face 24 of the piezoelectric plate 2, a connection region 42 located on the right-hand part of the substrate face FS, and a narrow conductive bridge connecting the electrode 41 and the region 42 and straddling the plate side 22 as well as the edge 33 of the contact region 31 of the first electrode 3.

According to one embodiment, the second electrode 41 is a metallic plate, made of aluminium for example, and has a length L of the order of 30 $\mu$m or less, and a width 1 of the order of 20 $\mu$m. A large longitudinal side 411 of the electrode 41 is substantially colinear with the longitudinal axis of the plate 2, and the length l of the of the electrode 41 is substantially equal to one third of the length of the plate 2, so that the other large longitudinal side 412 of the electrode 41 is withdrawn from the side 22 on the face of the plate 24. Like the plate 2, the electrode 41, the bridge 43 and the connection region 42 are centered and aligned along a large axis II—II of the substrate face FS. Typically, the length L of the electrode 41 is substantially smaller than half the length of the plate 2, the constant width of the bridge 43 is substantially smaller than the length L of the electrode 41, and the length of the connection region 42 is substantially equal to that of the plate 2, as shown in FIG. 3.

The link bridge 43 is a thin, overhanging part with a constant width, forming a monolithic part with the connection region 42. The bridge 43 has a thickness which is typically about a quarter of the thickness of the region 42. The far edge 431 of the bridge 43 is parallel to the substrate face FS and is joined to the upper face 413 of the electrode 41, in extending along the right-hand side 412 of this electrode.

The connection region 42 is rectangular, and is connected to the end of a second connection wire f2, made of gold for example, by means of a solder pellet P2 which is deposited on the upper face of the region 42. For the application envisaged, to a bulk wave line, the wires f1 and f2 connect the piezoelectric transducer 1 to a microwave electrical signal generator.

Figure 4A:
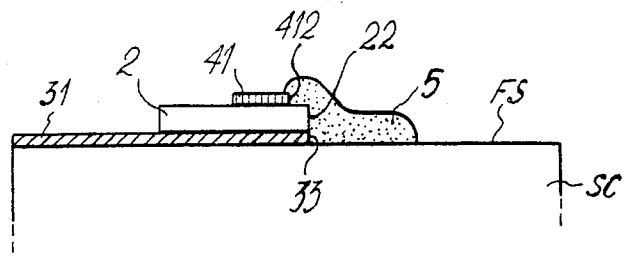
FIGS. 4A, 4B, 4C and 4D are schematic views, similar to that of FIG. 2, respectively illustrating four steps for the fabrication of the transducer, pertaining chiefly to the making of a link bridge.

After metallization of the first contact region 31, the fixing of the piezoelectric plate 2 and the metallization of the second electrode, the making of the link bridge 43, which may be called an "air gap bridge" or an "overhead" bridge, comprises chiefly the following four successive steps, illustrated in FIGS. 4A to 4D:

(A) A layer of photosensitive resin 5 is deposited to the right of the second electrode 41, the piezoelectric plate 2 and the contact region 31, and covers the sides 412 and 22 and the edge 33, and a portion of the substrate face FS on a width greater than that of the bridge 43 to be made, as shown in FIG. 4A.

Figure 4B:
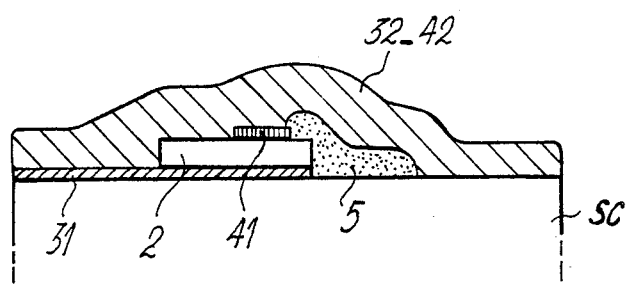

(B) A metallic layer 32-42 made of gold, having a large thickness of more than 1 $\mu$m, is deposited in order to cover, firstly, on the left-hand side of the face FS, the entire contact region 31 as well as the plate 2 and the second electrode 41 and, secondly, the right-hand part of the face FS as well as the resin layer 5, as shown in FIG. 4B.

Figure 4C:
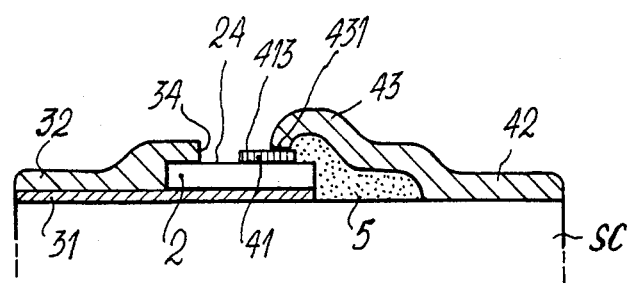

(C) The metallic layer 32-42 is machined by etching up to a means thickness of 0.4 $\mu$m to define, firstly, the contour of the first connection region 32 and, in particular, the lateral edge 34 of this region on the upper face 24 of the piezoelectric plate and, secondly, the contours of the unit comprising the bridge 43 and the second connection region 42, thus clearing a part of the upper face 24 of the plate 2 and, as the case may be, partially clearing the upper face 413 of the electrode 41, in leaving the bridge end 431 on the region 41, as shown in FIG. 4C.

Figure 4D:
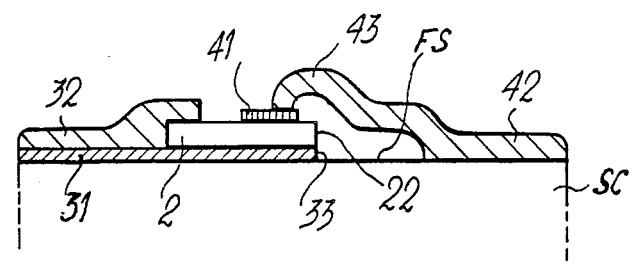

(D) The resin 5, localized beneath the link bridge 43, is finally removed by dissolving, as shown in FIG. 4D.

The length of the bridge thus made is smaller than or in the range of 30 $\mu$m. This gives it a low inductance and enables the second electrode 41, having a small area, to be connected to the connection region 42, offering an appreciably greater area to achieve the link by solder P2 with the connection wire f2. In particular, for a piezoelectric plate with a very high coupling coefficient, for example made of lithium niobate, the transducer 1 may achieve an electrical admittance close to that of a standard microwave generator, of the order of $20 \times 10^{-3}$ Mhos for high frequencies of some gigahertz. Furthermore, the admittance of the transducer is hardly modified by the fact of the low inductance of the "air gap bridge" or "overhead" link bridge 43, and very efficient impedance matching can be achieved by simple tuning.

It must be noted that the piezoelectric transducer according to the invention may be, for example, an input transducer or an output transducer of a bulk wave delay line, or the sole transducer of an echo line or the sole transducer of an acousto-optical line.

Should the acousto-optical line have a transparent substrate, made of quartz for example, and should it be an acousto-optical deflector, called a Bragg cell, for which a laser beam is directed under Bragg incidence towards a large, vertical, lateral face of the substrate to be deflected by it, a passband in broadened frequency is obtained. In effect, this frequency band is inversely proportionate to the width of the acoustic beam that gets propagated in the substrate which is itself determined by the dimensions of the second electrode 41 placed on the piezoelectric plate 2.

To obtain redundancy, it is the usual practice to provide for several transistors: this is the case notably for Bragg cells.

The transducer fabrication method according to the invention is well suited to this configuration.

Figure 5:
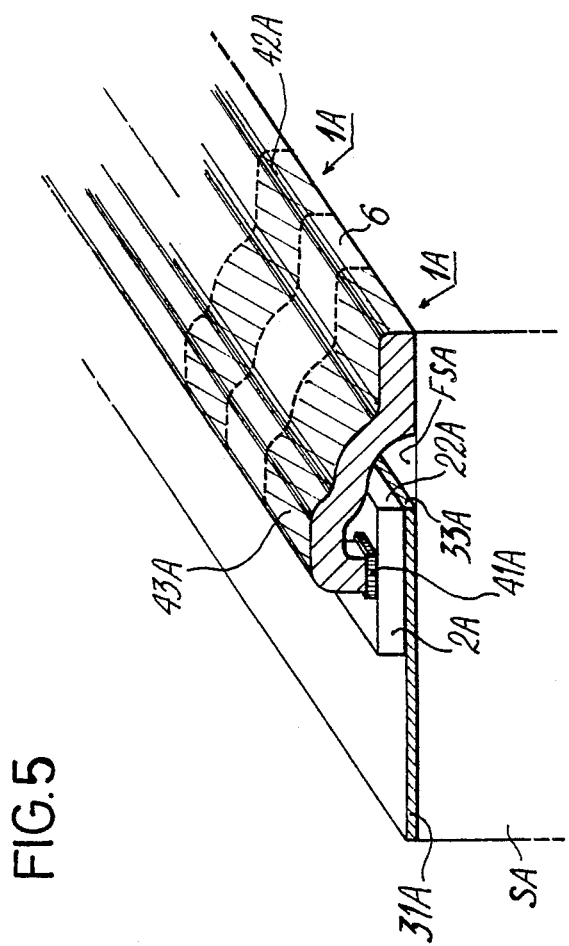
FIG. 5 is a schematic view in perspective of a set of piezoelectric transducers according to the invention, juxtaposed on an upper face of a crystalline substrate.

As shown in FIG. 5, several piezoelectric transducers 1A have, in common, a single first contact region 31A placed on the extreme face FSA of a crystalline substrate SA. Each transducer 1A has a piezoelectric plate 2A and a second electrode 41A which are aligned transversally to the face FSA and are arranged similarly to the way described for the transducer 1.

Link bridges 43A and second connection regions 42A, respectively associated with the transducers 1A, are made all along the edge 33A of the common ground plane 31A and the sides 22A of the plates 2A according to the three successive steps A, B and C described above. Before the step D, an additional step consists in hollowing out the metallic layer 32-42 by etching up to the resin layer 5 and the substrate face FS to prepare separation interstices 6 between the units comprising the bridge 43A and the connection region 42A of the transducers. Then, at the stage D, the resin layer 5 is removed, and the connection regions 42A with the bridges 43A of the transducers appear: they are juxtaposed perpendicularly to the ground contact region 31A on the substrate face FSA.

What is claimed is:

1. A piezoelectric transducer comprising a plane contact region of a first electrode, placed on a face of a support, a piezoelectric plate placed on the contact region, and a second electrode connected, by soldering, to a connection wire, wherein the second electrode is electrically connected to a connection region by a link bridge straddling one side of the piezoelectric plate and being separated therefrom by an air gap, said connection region being placed on the supporting face and supporting the solder at the connection wire.

2. A transducer according to claim 1, wherein the link bridge forms an overhanging portion, monolithically integrated with the connection region.

3. A transducer according to claim 1, wherein one end of the link bridge partially covers one face of the second electrode opposite the piezolectric plate.

4. A transducer according to claim 1, wherein the width of the link bridge is smaller than the length of a side of the second electrode, also straddled by the bridge.

5. A transducer according to claim 1, wherein the connection region is appreciably bigger than the second electrode.

6. A transducer according to claim 1, wherein the second electrode has a length of the order of 30 $\mu$m or less, a second dimension of the second electrode being of the order of 20 $\mu$m.

7. A transducer according to claim 1, wherein the link bridge has a length of the order of 30 $\mu$m.

8. A transducer according to claim 1, wherein said side of the piezoelectric plate straddled by the link bridge is coplanar with an edge of the contact region.

9. A piezoelectric transducer comprising a plane contact region of a first electrode, placed on a face of a support, a piezoelectric plate placed on the contact region, a second electrode connected, by soldering, to a connection wire, wherein the second electrode is electrically connected to a connection region by a link bridge straddling one side of the piezoelectric plate and being separated therefrom by an air gap, said connection region being placed on the supporting face and supporting the solder at the connection wire; and another connection region for the first electrode which supports a solder to another connection wire and covers a side of the piezoelectric plate opposite said side of the plate straddled by the link bridge and, partially, the contact region.

10. A set of piezoelectric transducers, each transducer comprising a plane contact region of a first electrode, placed on a face of a support, a piezoelectric plate placed on the contact region, and a second electrode connected, by soldering, to a connection wire, wherein the second electrode is electrically connected to a connection region by a link bridge straddling one side of the piezoelectric plate and being separated therefrom by an air gap, said connection region being placed on the supporting face and supporting the solder at the connection wire; said transducers having in common a single contact region, the link bridges and the connection regions of the second electrodes of the transducers being placed in parallel on the support face, and being separated by interstices.

11. A method for the fabrication of a piezoelectric transducer having a plane contact region of a first electrode, placed on a face of a support, a piezoelectric plate placed on the contact region, and a second electrode connected, by soldering, to a connection wire, wherein the second electrode is electrically connected to a connection region by a link bridge straddling one side of the piezoelectric plate and being separated therefrom by an air gap, said connection region being placed on the supporting face and supporting the solder at the connection wire, comprising the steps of, after deposition of the contact region of the first electrode, the piezoelectric plate and the second electrode:

(A) Deposition of a layer of resin partially on the piezoelectric plate and the second electrode, and on the support face, on either side of the plate side to be straddled by said bridge, (B) Deposition of a metallic layer to cover at least the resin layer and a portion of the support face not covered by the contact region, (C) Machining of the metallic layer to define at least the link bridge and the connection region connected to the second layer, and (D) Removal of the resin layer.

12. A method according to claim 11, wherein the metallic layer is also deposited on the contact region and on the piezoelectric plate, and is also machined to define a connection region of the first electrode.

13. A method for the fabrication of a set of piezoelectric transducers with each transducer having a plane contact region of a first electrode, placed on a face of a support, a piezoelectric plate placed on the contact region, and a second electrode connected, by soldering, to a connection wire, wherein the second electrode is electrically connected to a connection region by a link bridge straddling one side of the piezoelectric plate and being separated therefrom by an air gap, said connection region being placed on the supporting face and supporting the solder at the connection wire; said transducers having in common a single contact region, the link bridges and the connection regions of the second electrodes of the transducers being placed in parallel on the support face, and being separated by interstices; said method comprising the steps of, after deposition of the contact region of the first electrode, the piezoelectric plate and the second electrode:

(A) Deposition of a layer of resin partially on the piezoelectric plate and the second electrode, and on the support face, on either side of the plate side to be straddled by said bridge, (B) Deposition of a metallic layer to cover at least the resin layer and a portion of the support face not covered by the contact region.

(C) Machining of the metallic layer to define at least the link bridge and the connection region connected to the second layer, and (D) Removal of the resin layer;

wherein the machining also consists in hollowing out the deposited metallic layer up to the resin layer and the support face in order to prepare said interstices between the link bridge/connection region sets of the second electrodes of the transducers.

* * * * *